(12) United States Patent
Hama et al.

(10) Patent No.: US 8,541,777 B2
(45) Date of Patent: Sep. 24, 2013

(54) COLOR CONVERSION FILM AND MULTICOLOR-EMITTING, ORGANIC ELECTROLUMINESCENT DEVICE COMPRISING THE COLOR CONVERSION FILM

(75) Inventors: Toshio Hama, Yokosuka (JP); Masaru Nagai, Nagano (JP); Chong Li, Matsumoto (JP); Koji Kawaguchi, Matsumoto (JP); Yuko Nakamata, Matsumoto (JP); Naoyuki Kanai, Matsumoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 175 days.

(21) Appl. No.: 12/747,882

(22) PCT Filed: Jan. 21, 2009
(Under 37 CFR 1.47)

(86) PCT No.: PCT/JP2009/050880
§ 371 (c)(1),
(2), (4) Date: Sep. 30, 2011

(87) PCT Pub. No.: WO2010/084587
PCT Pub. Date: Jul. 29, 2010

(65) Prior Publication Data
US 2012/0032151 A1 Feb. 9, 2012

(51) Int. Cl.
*H01L 29/08* (2006.01)
(52) U.S. Cl.
USPC .............................................. 257/40; 257/89

(58) Field of Classification Search
USPC ...................................................... 257/40, 89
See application file for complete search history.

(56) References Cited

U.S. PATENT DOCUMENTS 8,304,265 B2 * 11/2012 Nakamura et al. .............. 438/29
2008/0252198 A1 10/2008 Katano et al.

FOREIGN PATENT DOCUMENTS

| EP | 1868419 A1 | 12/2007 |
|---|---|---|
| JP | 2000-026852 A | 1/2000 |
| JP | 2000-273316 A | 10/2000 |
| JP | 2007-157550 A | 6/2007 |
| JP | 2008-056797 A | 3/2008 |
| WO | WO-00/18193 A1 | 3/2000 |
| WO | WO-2006-103907 A1 | 10/2006 |

* cited by examiner

*Primary Examiner* — Douglas Menz
(74) *Attorney, Agent, or Firm* — Rabin & Berdo, P.C.

(57) ABSTRACT

A color conversion film is disclosed that absorbs light from an organic electroluminescent part emitting blue-green light and converts the light to visible light at a longer wavelength. The color conversion film includes two different dyes. A first dye is a polymer dye with an average molecular weight of 1000 to 1,000,000 that absorbs light incident on the color conversion film and transfers the energy of the light to a second dye. The second dye is a dye that receives the energy from the first dye and emits light. With a multicolor-emitting, organic electroluminescent device including the color conversion film, it is possible to achieve excellent conversion efficiency without increasing the thickness of the color conversion film as in a conventional device using a binder resin.

20 Claims, 3 Drawing Sheets

COLOR CONVERSION FILM AND MULTICOLOR-EMITTING, ORGANIC ELECTROLUMINESCENT DEVICE COMPRISING THE COLOR CONVERSION FILM

BACKGROUND OF THE INVENTION

1. Field of the Invention

The present invention relates to a color conversion film. More specifically, the color conversion film of the present invention is a color conversion film providing excellent conversion efficiency. The present invention relates to a multicolor emitting organic electroluminescent device comprising this color conversion film. An organic electroluminescent device is also referred to as an Organic Light-emitting Dingle (OLED). Such a multicolor emitting organic electroluminescent device can be applied to personal computers, word processors, televisions, fax machines, audio and video equipment, car navigation systems, desktop calculators, telephones, portable terminals, industrial instruments and the like.

2. Description of the Related Art

In recent years, there has been active research into practical applications for organic electroluminescent elements, which are essential components of organic electroluminescent devices. Because organic electroluminescent elements can provide high current densities at low voltages, they are expected to provide a high level of brightness and luminescent efficiency, and should be applicable in particular to organic multicolor luminescent devices capable of high definition multicolor or full color display.

In terms of specific full color systems, the current focus of attention is on color conversion (CCM) systems, which combine a color conversion film with a color filter.

In a CCM system, blue or blue-green light from an organic electroluminescent layer for example is absorbed by a fluorescent dye, converting this light to visible light at longer wavelengths from green to red. From the standpoint of productivity and cost, this system is better than a separate-color RGB system in which organic electroluminescent layer materials are designed for red (R), green (G) and blue (B) pixels. From the standpoint of color reproducibility, this system is better than a white/color filter system, which combines color filters with an organic electroluminescent element emitting white light.

In a conventional CCM system using a color conversion film comprising a dye dispersed in a binder resin, the conversion efficiency is not very high when obtaining red luminescence from blue or blue-green luminescence, and red color conversion films in particular are in need of improvement.

When the concentration of the color conversion substance is increased in the color conversion film, the absorbed energy is expended as it moves back and forth between identical molecules without producing luminescence, a phenomenon that is called concentration quenching.

One means of controlling concentration quenching would be to reduce the concentration of the color conversion substance in the binder resin, but adequate converted light strength might not be obtained in this case due to reduced absorption of the light to be absorbed.

Therefore, as a means of obtaining adequate converted light strength while controlling concentration quenching, the thickness of the color conversion film is increased to thereby increase light absorption and maintain color conversion efficiency.

When such a thick color conversion film (about 10 μm thick) is used, however, the electrode pattern is interrupted by changes in level, and it may be difficult to attain high definition. When such a thick color conversion film is combined with an organic electroluminescent element, moreover, the organic electroluminescence layer may be degraded by moisture or solvent remaining in the color conversion film, resulting in display defects.

The color conversion film should also be as thin as possible because the view angle dependence is reduced if the film is too thick.

Under these circumstances, the following techniques have been disclosed in the context of color conversion films and related technologies.

Japanese Patent Application Laid-open No. 2008-056797 discloses a fluorescent material containing a polyimide having a repeating unit represented by a specific formula, and discloses in particular a fluorescent material containing a green light emitting polyimide and a purple light emitting polyimide.

Japanese Patent Application Laid-open No. 2007-157550 discloses a color conversion film with a thickness of 2 μm or less containing a first dye and a second dye, wherein the first dye absorbs light incident on the color conversion film and transfers the energy of the light to the second dye, while the second dye receives the energy from the first dye and emits light. The first dye is contained in the color conversion membrane in an amount capable of sufficiently absorbing the incident light, and the second dye is contained in the amount of not more than 10 mol % based on the total constituent molecules of the color conversion film.

With the technology described in Japanese Patent Application Laid-open No. 2008-056797, however, because the fluorescent light emission wavelength is controlled in the blue to green range by changing the copolymerization ratio of the two polyimides, excellent conversion efficiency is not achieved because the emitted light is merely the sum of the fluorescence of the individual polyimides.

In the technology described in Japanese Patent Application Laid-open No. 2007-157550, on the other hand, a thin color conversion layer with a thickness of 2 μm or less is achieved by means of a method using a color conversion layer containing a host dye and a guest dye, in which the host dye is excited and the guest dye produces light by energy transfer from the host dye. Because the host dye and guest dye are formed by vapor deposition in this method, there is no wet process and no problems from moisture or solvent. Because patterning is by mask deposition, however, there is room for further improvement for application to large-scale displays.

Consequently, it is an object of the present invention to provide a color conversion film which can be made thin because no binder resin is used, which is applicable to large-scale displays, and which can provide excellent conversion efficiency.

It is also an object of the present invention to provide a multicolor emitting organic electroluminescent display using such a color conversion film.

SUMMARY OF THE INVENTION

The present invention is a color conversion film that absorbs light from an organic electroluminescent part emitting blue-green light and converts the light to visible light at a longer wavelength, wherein the color conversion film comprises two different dyes, a first dye that absorbs light incident on the color conversion films and transfers the energy of the light to a second dye, and the second dye that receives the energy from the first dye and emits light, and wherein the first dye is a polymer dye with an average molecular weight of 1000 to 1,000,000. The color conversion film of the present invention can be used as a component of a multicolor emitting organic electroluminescent device installed in a personal computer or the like.

In such a color conversion film, the second dye can be either a polymer dye with an average molecular weight of 1000 to 1,000,000 or a low-molecular-weight dye with an average molecular weight of less than 1000.

The first dye is preferably an oligomer comprised of luminescent cores bound to each other by non-covalent linking groups.

Preferably the maximum wavelength of an absorption spectrum of the first dye is 400 to 500 nm, and the maximum wavelength of a fluorescent spectrum thereof is 500 to 550 nm. At the same time, the maximum wavelength of an absorption spectrum of the second dye is preferably 500 to 550 nm, and the maximum wavelength of a fluorescent spectrum thereof is preferably 550 to 650 nm.

In addition, the second dye is preferably present in an amount of 10 wt % or less based on the total component molecules of the color conversion film.

The color conversion film described above is formed by a coating method.

The present invention also encompasses a multicolor emitting organic electroluminescent device comprising such a color conversion film. Specifically, the multicolor emitting organic electroluminescent device of the present invention is provided with a pair of electrodes at least one of which is transparent on a substrate, an organic electroluminescent part comprising an organic electroluminescent layer sandwiched between the pair of electrodes, and a color modulation part comprising a transparent support, a color filter and a color conversion film, wherein the color conversion film comprises two different dyes, with the first dye being a dye that absorbs light incident on the color conversion film and transfers the energy of the light to the second dye, while the second dye receives the energy from the first dye and emits light, and the first dye is a polymer dye with an average molecular weight of 1000 to 1,000,000.

The present invention relates to a host-guest type color conversion film using as the host material a polymer dye with an average molecular weight of 1000 to 1,000,000, and to a multicolor emitting organic electroluminescent device of a CCM system containing this color conversion film. With a multicolor emitting organic electroluminescent device of this configuration, it is possible to achieve excellent conversion efficiency without increasing the thickness of the color conversion film as in a conventional device using a binder resin.

Since the color conversion film can be annealed at high temperatures of 200° C. or more, no moisture and/or organic solvent remains even after the color modulation part is affixed to the organic electroluminescent part. Consequently, the color conversion film of the present invention can be applied suitably for durable, large-scale organic electroluminescent devices.

DETAILED DESCRIPTION OF THE INVENTION

Figure 1:
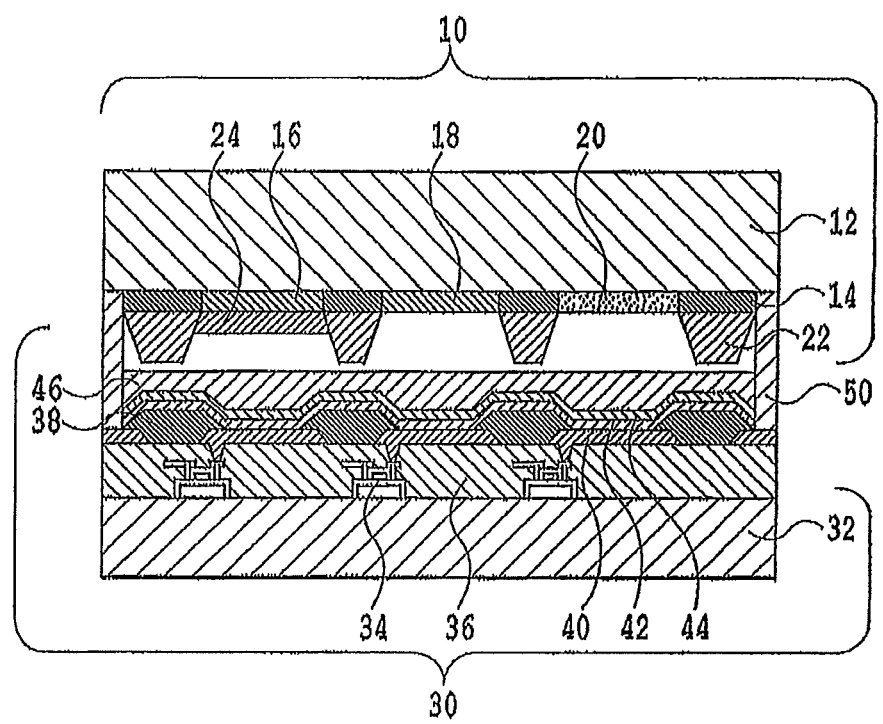
FIG. 1 is a diagram showing one example of a multicolor emitting organic electroluminescent device of the present invention.

Color Conversion Film and Formation Method
Color Conversion Film

The color conversion film of the present invention comprises two dyes for absorbing light from an organic electroluminescent part that emits blue-green light and converting the light to visible light at longer wavelengths, wherein the first dye is a dye that absorbs light incident on the color conversion film and transfers the energy of the light to the second dye, while the second dye is a dye that receives the energy from the first dye and emits light, and the first dye is a polymer dye with an average molecular weight of 1000 to 1,000,000.

First Dye

The first dye is a dye that absorbs light incident on the color conversion film, or in other words blue-green light emitted by the organic electroluminescent element, and transfers the absorbed energy to the second dye. Therefore, the absorption spectrum of the first dye preferably overlaps with the emission spectrum of the organic electroluminescent element, and the absorption maximum of the first dye preferably matches the maximum of the emission spectrum of the organic electroluminescent element. For example, the maximum wavelength of the absorption spectrum of the first dye is preferably 400 to 500 nm considering that the organic electroluminescent element emits blue-green light.

The emission spectrum of the first dye also preferably overlaps with the absorption spectrum of the second dye, and more preferably the maximum of the emission spectrum of the first dye matches the absorption maximum of the second dye. For example, the maximum wavelength of the fluorescence spectrum of the first dye is preferably 500 to 550 nm considering the preferred range of the maximum wavelength of the absorption spectrum as described above.

In the present invention, the first dye is a polymer dye with an average molecular weight of 1000 to 1,000,000. Examples of such polymer dyes include fluorene copolymer dyes such as dimethylphenyl-terminated poly[(9,9-dioctyl-2,7-divinylene-fluorenyl)-Alt-Co-{2-methoxy-5-(2-ethyl-hexyloxy)-1,4-phenylene}] (absorption maximum wavelength 479 nm, fluorescence maximum wavelength 539 nm), dimethylphenyl-terminated poly[(9,9-dioctylfluorenyl-2,7-diyl)-Co-1,4-benzo-(2-1'-3)-thiadiazole] (absorption maximum wavelength 450 nm, fluorescence maximum wavelength 535 nm) and the like.

An oligomer material in which the core material has a structure of repeating units linked via linking groups can be used as a constituent dye of the color conversion film.

In this case, this dye can be an oligomer made up of fluorescent emitting cores linked to each other by non-covalent linking groups.

The emitting cores are preferably of a compound having fluorescent emission properties in the visible range. Specific examples of compounds that provide green to yellow light emission include perylene derivatives, $Alq_3$ (tris 8-quinolinolate aluminum complex) and other aluminum chelate dyes and 3-(2-benzothiazolyl)-7-diethylaminocoumarin (coumarin 6), 3-(2-benzoimidazolyl)-7-diethylaminocoumarin (coumarin 7), coumarin 135 and other coumarin dyes. A naphthalimide dye such as solvent yellow 43, solvent yellow 44 or the like can also be used.

A non-covalent linking group in this case is a group that links light emitting cores without π electrons. Examples of such linking groups include —O—, —S—, —$SiR_2$—, —$CR_2$— and the like (wherein R is an alkyl group in both cases).

Second dye—As discussed above, the emission spectrum of the first dye preferably overlaps the absorption spectrum of the second dye, and the maximum of the emission spectrum of the first dye preferably matches the maximum of the absorption spectrum of the second dye. Consequently, the light emitted by the second dye is of a longer wavelength than the light absorbed by the first dye.

In the present invention, the second dye may be either a polymer dye with an average molecular weight of 1000 to 1,000,000 or a low-molecular-weight dye with an average molecular weight of less than 1000.

Examples of specific polymer dyes include phenylene vinylene copolymer dyes such as dimethylphenyl-terminated poly[2-methoxy-5-(3,7-dimethyl-octyloxy)-1,4-phenylene vinylene] (absorption maximum wavelength 509 nm, fluorescence maximum wavelength 575 nm), polyhedral oligosilsesquioxane-terminated poly[2-methoxy-5-(3,7-dimethyl-octyloxy)-1,4-phenylene vinylene] (absorption maximum wavelength 509 nm, fluorescence maximum wavelength 575 nm), dimethylphenyl-terminated poly[2-5-bis(3,7-dimethyl-octyloxy)-1,4-phenylene vinylene] (absorption maximum wavelength 506 nm, fluorescence maximum wavelength 582 nm), dimethylphenyl-terminated poly[2-methoxy-5-(2-ethylhexyl-oxy)-1,4-phenylene vinylene] (absorption maximum wavelength 490 nm, fluorescence maximum wavelength 585 nm), polyhedral oligosilsesquioxane-terminated poly[2-methoxy-5-(2-ethylhexyl-oxy)-1,4-phenylene vinylene] (absorption maximum wavelength 490 nm, fluorescence maximum wavelength 585 nm) and the like.

Examples of low-molecular-weight dyes include perylene dyes; cyanine dyes such as 4-dicyanomethylene-2-methyl-6-(p-dimethylaminostyryl)-4H-pyran (DCM-1) ((I) below), DCM-2 ((II) below) and DCJTB ((III) below); 4,4-difluoro-1,3,5,7-tetraphenyl-4-bora-3a,4a-diaza-s-indacene ((IV) below), Lumogen F red and Nile red ((V) below). A xanthene dye such as Rhodamine B, Rhodamine 6G or the like or a pyridine dye such as pyridine 1 can also be used.

Cl:

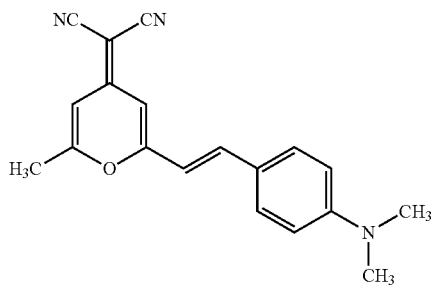

(I)

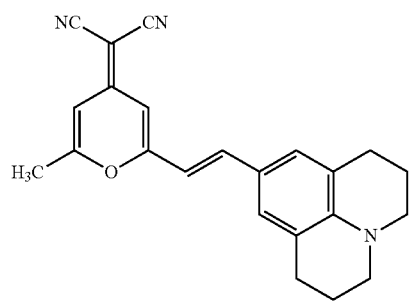

(II)

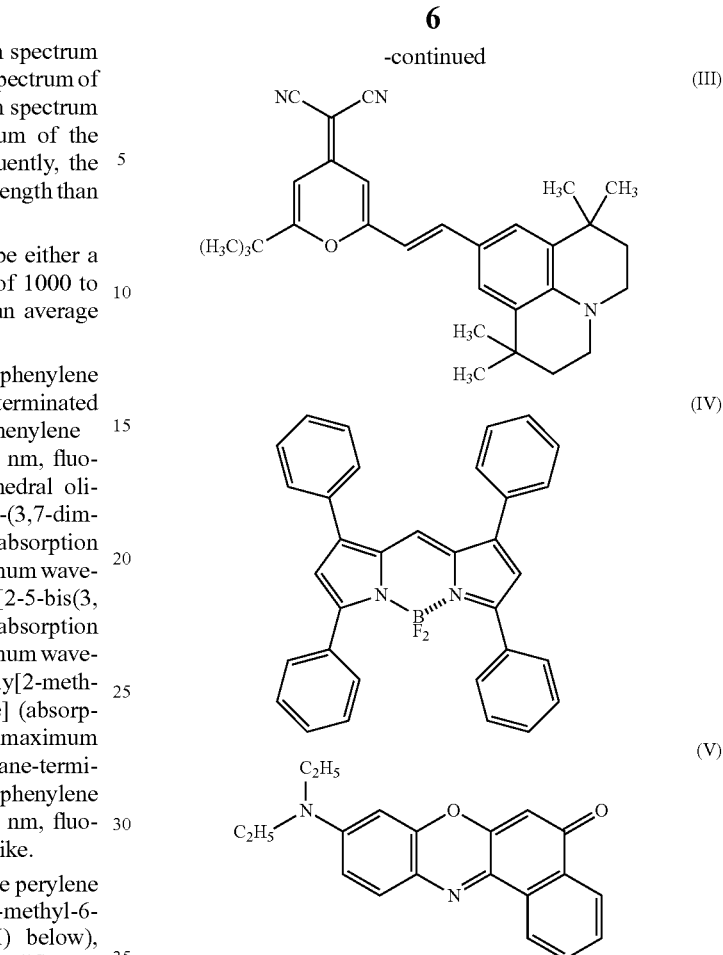

Since the dye that emits light in the color conversion film of the present invention is the second dye, it is a condition for achieving high conversion efficiency that the second dye not cause concentration quenching.

The upper limit of the concentration of the second dye in the color conversion film may differ depending on the type of first dye and second dye, as long as the second dye does not cause concentration quenching. By contrast, the lower limit of the concentration of the second dye in the color conversion film may differ depending on the type of first dye and second dye and on the intended use, as long sufficient converted light strength is obtained.

A desirable concentration of the second dye in the color conversion film of the present invention is 10 wt % or less. Keeping the concentration of the second dye within this range serves to prevent concentration quenching while at the same time providing adequately converted light strength.

Method for Forming Color Conversion Film

The color conversion film of the present invention can be prepared by coating a liquid comprising a mixture of the first dye and second dye on a transparent support or color filter for example. Glass, polyimide, polycarbonate, polyethylene terephthalate, polyethylene naphthalate, polybutylene terephthalate, polyethylene sulfone or another polymer material can be used for the transparent support. When a polymer material is used for the color conversion film, the transparent support can be either rigid or flexible. The transparent support preferably has a transmission factor of 80% or more with respect to visible light.

The color conversion film of the present invention can be formed by various coating methods (including inkjet and dispenser methods).

When the color conversion film is formed by the inkjet method, the first and second dyes are used dissolved in solvents.

Toluene, tetrahydrofuran, chloroform, tetralin or the like can be used as the solvent. The solvent concentration can be 0.5 to 5 wt % in both cases. If the concentration is at least 0.5 wt % the one-time coated amount will not be too small, while if it is 5 wt % or less there will be no risk of clogging during discharge.

When the color conversion film is formed by the dispenser method, it is desirable from the standpoint of discharge volume and clogging that the conditions be set as in the inkjet method.

Coating is preferably followed by drying, and the drying conditions can be 30 to 60 minutes at 150 to 200° C. At 150° C. and above adequate solvent evaporation can be achieved, while at 200° C. and below thermal degradation of the dye can be prevented. A drying time of 20 minutes or more allows for thorough drying, while a time of 60 minutes or less serves to prevent film oxidation.

The thickness of a color conversion film obtained by coating and drying in this way is preferably 2000 nm (2 μm) or less from the standpoint of light absorption from the organic electroluminescent part, or more preferably 100 to 2000 nm from the standpoint of providing fluorescence to the outside, and 200 to 1000 nm is especially desirable from the standpoint of conversion efficiency.

In the color conversion film of the present invention prepared in this way, the first dye constituting the most part of the film has the function of absorbing incident light. As a result, adequate absorption can be achieved even with a thin film such as that described above.

This is thought to be because most of the excitation energy of the first dye is transferred to the second dye and can contribute to light emission by the second dye rather than being quenched by movement between molecules of the first dye (concentration quenching). Since the second dye is present at too low a concentration to produce concentration quenching as discussed above, the transferred excitation energy can be used efficiently in color conversion to produce light having the desired wavelength distribution. In this way, high conversion efficiency can be achieved with a thin film thickness in the color conversion film of the present invention.

Multicolor Emitting Organic Electroluminescent Device and Manufacturing Method

The multicolor emitting organic electroluminescent device of the present invention contains an organic electroluminescent element and the aforementioned color conversion film, and the organic electroluminescent element contains a pair of electrodes at least one of which is transparent and an organic electroluminescent layer sandwiched between this pair of electrodes.

FIG. 1 is a cross-section showing one example of a multicolor emitting organic electroluminescent device of the present invention. In this figure, the multicolor emitting organic electroluminescent device is provided with color modulation part 10, organic electroluminescent part 30 and seal material 50, with color modulation part 10 and organic electroluminescent part 30 arranged facing each other with seal material 50 between the two.

The components of the multicolor emitting organic electroluminescent device of the present invention and the methods for forming them are explained in detail below.

Color Conversion Part and Formation Method

As shown in FIG. 1, color modulation part 10 is a laminate comprising black matrix 14, red color filter 16, green color filter 18, blue color filter 20, banks 22 and red conversion film 24 formed in that order from top to bottom in the figure on transparent support 12.

In fact, the order of the layers in FIG. 1 is upside-down from the order during formation of color modulation part 10, so the components of the color modulation part are explained in the order in which they are laminated during the process of forming the color modulation part as explained below (from top to bottom in FIG. 1).

FIG. 2 is a diagram showing the steps for forming color modulation part 10, which is a component of the multicolor emitting organic electroluminescent device shown in FIG. 1, (a) showing the step of preparing transparent support 12, (b) showing the step of forming black matrix 14, (c) showing the step of forming color filters 16 to 20, (d) showing the step of forming banks 22 and (e) showing the step of forming color conversion film 24.

Transparent Support 12

Figure 2A:
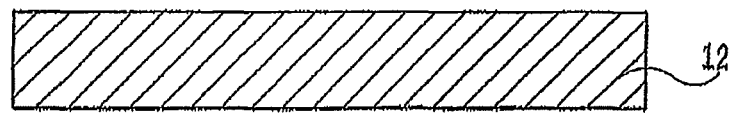
FIG. 2 is a diagram showing in sequence the steps for manufacturing a color conversion film which is a constituent element of the multicolor emitting organic electroluminescent device shown in FIG. 1, with (a) being the substrate preparation step, (b) the black matrix formation step, (c) the color filter formation step, (d) the bank formation step and (e) the color conversion film formation step.

Transparent support 12 is provided first as shown in FIG. 2(a). Glass, polyimide, polycarbonate, polyethylene terephthalate, polyethylene naphthalate, polybutylene terephthalate, polyethylene sulfone or another polymer material can be used for transparent support 12. In the present invention, as discussed above, a polymer material is used for red color conversion film 24. Thus, transparent support 12 may be either rigid or flexible. Transparent support 12 preferably has a transmission factor of 80% or more with respect to visible light.

Black Matrix 14

Figure 2B:
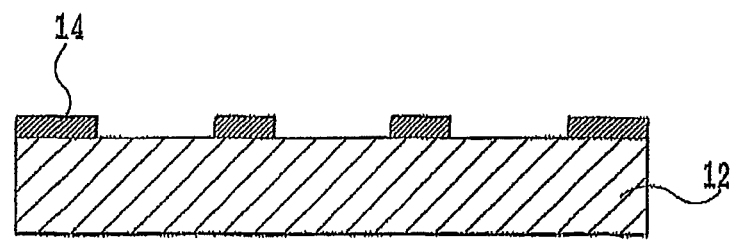

Next, as shown in FIG. 2(b), black matrix 14 is formed on transparent support 12. Black matrix 14 is a layer arranged with the aim of improving contrast at the locations of color filters 16 to 20 as described below. A material that does not transmit visible light is used for black matrix 14.

Black matrix 14 can be applied to transparent support 12 by a wet process coating method such as spin coating, heat dried, and then patterned by photolithography or the like.

An acrylic resin or other photosensitive resin mixed with a coloring agent to blacken the resin can be used for black matrix 14. A black mask material used in liquid crystal display devices can also be used.

By providing black matrix 14 as necessary, it is possible to effectively prevent light diversion from adjacent pixels, or in other words leakage of light from one pixel into the color filter layer corresponding to a neighboring pixel. High contrast can be achieved in this way. Formation of black matrix 14 is also an effective means of reducing level differences caused by formation of color filters 16 to 20 as discussed below.

Color Filters 16 to 20

Figure 2C:
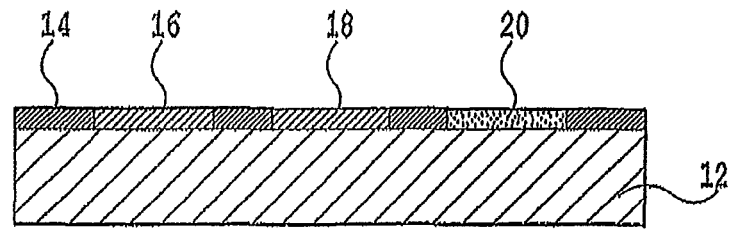

Next, as shown in FIG. 2(c), color filters 16 to 20 are formed in the regions defined by black matrix 14 on transparent support 12. Red color filter 16, which transmits wavelengths of 600 nm and more, green color filter 18, which transmits wavelengths of 500 nm to 550 nm, and blue color filter 20, which transmits wavelengths of 400 nm to 550 nm, are disposed as color filters.

Specifically, a matrix resin containing a dye or pigment having the desired color absorption is coated by a wet process such as spin coating on transparent support 12 and patterned by photolithography, and the unwanted portion is removed with a developing fluid to form color filters 16 to 20.

To improve the quality of the multicolor emitting organic electroluminescent device, the moisture remaining in color filters 16 to 20 should preferably be thoroughly removed by high-temperature heating after formation of color filters 16 to 20 by a wet process.

In the example shown in FIG. 2, materials that separate incident light and transmit only light in the desired wavelength range can be used as the materials of color filters 16 to 20.

As shown in FIG. 2(c), color display is achieved with color filters 16 to 20 to a combination of the three colors R, G and B provided with corresponding pixels. In FIG. 2(c) three color filters 16, 18 and 20 are used for red, green and blue (R, G, B), but 1, 2, or 4 or more color filters can be used as necessary. A dielectric multilayer or other optical thin film can also be used for the color filters.

Color filters 16 to 20 can be made of dyes or colors that absorb the desired colors, dispersed in a polymer matrix resin. Specifically, any material well known in the field can be used, such as materials used in commercial flat panel displays. For example, the filters can be formed using color filter materials for liquid crystal use (Fuji Film Electronics Materials Color Mosaic or the like).

Such materials can be used for color filters 16 to 20, but the properties of the color filters are preferably adjusted in accordance with the light emitted by the organic electroluminescent element to optimize the output efficiency and color purity. The light that is cut here is light at wavelengths 480 nm or below and 560 nm or above as necessary in the case of green, light of wavelengths 490 nm or above in the case of blue and light of wavelengths 580 nm or below in the case of red.

More preferably, these color filters are used to adjust the colors to NTSC standards or to current CRT chromaticity coordinates. The chromaticity coordinates can be measured with an ordinary chromaticity coordinate meter, such as a Topcon BM-7, SR-1 or the like. In order to obtain light in the desired wavelength range with high color purity, the thickness of color filters 16 to 20 should be 0.5 to 20 μm, or more preferably 1 to 1.5 μm.

Banks 22

Figure 2D:
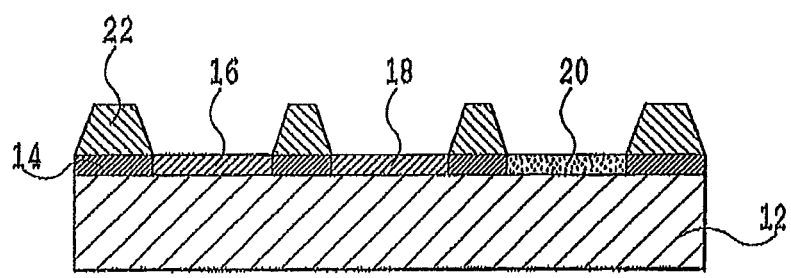

Next, as shown in FIG. 2(d), banks 22 are formed on black matrix 14. A resist or other photocurable resin or photo-thermosetting resin can be used as the material of banks 22. From the standpoint of obtaining pixels with excellent pattern accuracy, banks 22 should preferably be formed by a photo process.

A material that is lyophilic with respect to the ink used to form color conversion film 24 as discussed below is preferably used for banks 22. Specifically, it is desirable to use a material having a contact angle of 30° C. or less or more preferably 20° C. or less with the ink used to form the color conversion film 24.

For example, such lyophilicity can be conferred by dispersing inorganic particles in banks 22. The height of banks 22 is such that the ink does not overflow the banks when the ink is dripped.

Examples of materials used to form banks 22 in the example shown in FIG. 2 include, but are not limited to, (1) compositions consisting of acrylic polyfunctional monomers and oligomers having multiple acryloyl groups or methacryloyl groups, together with optical or thermal polymerization initiators, (2) compositions consisting of polyvinyl cinnamic acid esters and sensitizing agents, (3) compositions consisting of chain or cyclic olefins and bisamides and (4) compositions consisting of acid generators and monomers having epoxy groups.

Color Conversion Film 24

Figure 2E:
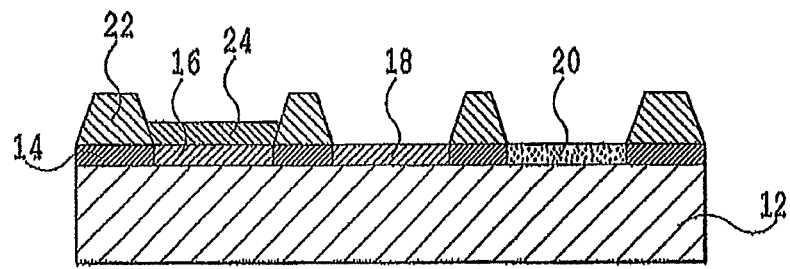

Finally, as shown in FIG. 2(e), color conversion film 24 is formed in the regions delineated by color filters 16 to 20 and banks 22. Color conversion film 24 is formed as described above. In the example shown in FIG. 2(e), a red color conversion film is formed on a color filter.

The color modulation part 10 shown in FIG. 1 is thus obtained by means of steps 2(a) to 2(e).

Organic Electroluminescent Part and Formation Method

As shown in FIG. 1, organic electroluminescent part 30 is a laminate comprising TFT element 34, insulating film 36, interlayer insulating film 38, first electrode 40, organic electroluminescent film 42, second electrode 44 and inorganic barrier layer 46 formed in that order on substrate 32 from bottom to top in FIG. 1.

The components of the electroluminescent part are explained below in the order in which they are laminated (from bottom to top in FIG. 1).

Substrate 32

In the multicolor emitting organic electroluminescent device of the present invention, substrate 32 of the organic electroluminescent part does not necessarily have to be transparent in order for light to be obtained from color modulation part 10. For example, Al and other metal materials, glass, quartz and other amorphous substrates and resin and other transparent and semi-transparent materials can be used. Alternatively, opaque materials such as Si, GaAs and other crystalline substrates can be used. In addition to glass and the like, alumina and other ceramics and stainless steel and other metal sheets that have been insulated with a surface oxide or the like, phenol resin and other thermosetting resins and polycarbonate and other thermoplastic resins and the like can be used.

TFT Element 34

TFT element 34 has a bottom gate type structure with a gate electrode below a gate insulating film, and uses a polycrystalline silicon film as the active layer. Specifically, a conventional polycrystalline silicon TFT can be used.

TFT element 34 is formed so as to connect via a wiring electrode (not shown) to first electrode 40 (described below) at the end of each pixel. Any known formation method can be used. The dimensions of the TFT element are preferably 10 to 30 μm. In addition, the dimensions of the pixels are normally between 20 μm×20 μm and 300 μm×300 μm.

Insulating Film 36, Interlayer Insulating Film 38

Insulating layer 36 and interlayer insulating film 38 are layers having insulating properties such as layers formed by sputtering or vacuum deposition of an inorganic material such as silicon oxide or silicon nitride, silicon oxide layers formed by the spin on glass (SOG) method, or coats of photoresist, polyimide, acrylic resin or the like. Since wiring electrodes and the like are present on the contact regions of insulating layer 36 and interlayer insulating film 38, a material should be used that allows patterning so as not to damage the wiring electrodes and the like during patterning of 36 and 38.

Insulating layer 36 in particular also serves as a corrosion- and water-resistant film to prevent corrosion and or moisture damage to the wiring electrodes. Polyimide is therefore desirable as a material that performs these functions.

The thicknesses of insulating layer 36 and interlayer insulating film 38 are not particularly limited, and can be determined appropriately according to the material in order to obtain the necessary insulating properties, but thin films are preferably from the standpoint of manufacturing cost when using an inorganic material.

First Electrode 40

First electrode (anode) 40 is obtained for example by forming a metal electrode on a wiring electrode, and then forming a transparent oxide on the top surface thereof.

The metal electrode and transparent oxide can be formed by a suitable combination of a film formation method such as vapor deposition or sputtering with a patterning method such as photolithography.

First electrode 40 is connected to a wiring electrode, which is formed passing through insulating layer 36 formed on TFT element 34. First electrode 40 is normally the electrode that injects positive holes into organic electroluminescent film 42.

An oxide that is transparent and has a high work function can be used as the transparent oxide. This is not particularly limited, but tin-doped indium oxide (ITO), zinc-doped indium oxide (IZO), ZnO, $SnO_2$, $In_2O_3$ or the like is preferred. Of these, ITO and IZO are especially desirable. This layer of transparent oxide serves the function of improving hole injection efficiency into the organic electroluminescent layer. Forming a layer of transparent oxide also has a flattening effect, and helps to mitigate morphological disturbance at the base of the electroluminescent layer caused by irregularities on the metal electrode surface as discussed below.

A metal electrode with high reflectance on the transparent oxide is formed as the metal electrode. The electrode can thus exhibit high light reflectivity. The metal electrode may also be given the role of reducing electrical resistance. The metal electrode is preferably formed using a high reflectance metal, amorphous alloy or microcrystalline alloy. Examples of high reflectance metals include Al, Ag, Mo, W, Ni and Cr. Examples of high reflectance amorphous alloys include NiP, NiB, CrP and CrB. Examples of high reflectance microcrystalline alloys include NiAl and the like.

Organic Electroluminescent Film 42

Organic electroluminescent film 42 is a laminate of multiple layers such a positive hole injection layer, a hole transport layer, an organic emitting layer, an electron transport layer and an electron injection layer, and can be formed by forming each layer in sequence by vacuum deposition without using a deposition mask open to pixel regions on the entire surface of the substrate. Sample configurations of organic electroluminescent film 42 are given below, together with the anodes (first electrode 40) and cathodes (second electrode 44) disposed on either side of the film.

(1) Anode/organic emitting layer/cathode;
(2) Anode/hole injection layer/organic emitting layer/cathode;
(3) Anode/organic emitting layer/electron injection layer/cathode;
(4) Anode/hole injection layer/organic emitting layer/electron injection layer/cathode; and
(5) Anode/hole injection layer/hole transport layer/organic emitting layer/electron injection layer/cathode.

The materials of each layer in the organic electroluminescent film 42 are not particularly limited, and any known materials can be used.

A phthalocyanine (Pc) (such as copper phthalocyanine (CuPc)) or indanthrene compound or the like can be used for the hole injection layer.

Various materials with triarylamine partial structures, carbazole partial structures or oxadiazole partial structures (such as TPD, α-NPD, PBD, m-MTDATA and the like) can be used for the hole transport layer. A material consisting of one of these doped with a Lewis acid compound such as F4-TCNQ can also be used.

The material of the organic emitting layer can be selected appropriately according to the desired color hue.

A benzothiazole, benzimidazole, benzoxazole or other fluorescent brightener or a metal chelated oxonium compound, styrylbenzene compound, aromatic dimethylidene compound or the like can be used to obtain blue or blue-green emission.

Specifically the organic emitting layer can be formed by adding a dopant to a host material.

Alumichelate, 4,4'-bis(2,2'-diphenyl vinyl), 2,5-bis(5-tert-butyl-2-benzoxazolyl)-thiophene (BBOT), or biphenyl (DPVBi) can be used as the host material.

0.1 to 5% of perylene, 2,5,8,11-tetra-t-butylperylene (TBP), 4,4'-bis[2-{4-(N,N-diphenylamino)phenyl}vinyl]biphenyl (DPAVBi) or the like can be added as a blue dopant.

0.1 to 5% of 4-(dicyanomethylene)-2-methyl-6-(p-dimethylaminostyryl)-4H-pyran, 4,4-difluoro-1,3,5,7-tetraphenyl-4-bora-3a,4a-diaza-5-indacene, propane dinitrile (DCJT1), Nile red or the like can be added as a red dopant.

$Alq_3$ (tris(8-quinolinolato)aluminum complex) can be used for the electron transport layer. This can also be doped with an alkali metal such as Li.

An aluminum complex such as $Alq_3$, an aluminum complex doped with an alkali metal or alkali earth metal, or bathophenanthroline with an alkali metal or alkali earth metal added thereto can be added for the electron injection layer. LiF can also be used.

Second Electrode 44

Second electrode 44 on organic electroluminescent film 42 can be formed by first forming a buffer layer by vapor deposition, sputtering or the like and then forming thereon a further film of a metal oxide which is a transparent electrode material.

An alkali metal such as lithium, sodium or potassium, an alkali earth metal such as calcium, magnesium or strontium, an electron-injecting metal consisting of a fluoride of these, or an alloy or compound with another metal can be used for the buffer layer.

A material with a small work function such as the aforementioned is preferably used in order to improve electron injection. The thickness of the buffer layer can be selected appropriately taking into consideration the drive voltage, transparency and the like, but 10 nm or less is especially desirable.

A material such as ITO, IZO, ZnO or the like used in forming transparent conductive films can be used as the metal oxide.

Inorganic Barrier Layer 46

SiNx, SiOxNy or the like can be used for inorganic barrier film 46, which can be formed by plasma CVD or the like.

Method for Superimposing Color Modulation Part and Organic Electroluminescent Part, and Multicolor Emitting Organic Electroluminescent Device The color modulation part 10 and organic electroluminescent part 30 formed as described above are placed facing each other and superimposed. Specifically, color modulation part 10 and organic electroluminescent part 30 are introduced into a glove box in a dry nitrogen atmosphere (oxygen and moisture concentration both 10 ppm or less). Next, as shown in FIG. 1, seal material 50 consisting of UV curing resin is disposed between the ends of 10 and 30 to obtain a multicolor emitting organic electroluminescent device.

Because the multicolor emitting organic electroluminescent device of the present invention thus formed as shown in FIG. 1 contains a color conversion film which has both a thin film thickness and high conversion efficiency, it can be applied favorably to large-scale displays for personal computers and the like.

Example 1

Preparation of Organic Electroluminescent Display

Example 1 of Present Invention

Preparation of Color Modulation Part

Corning glass 500 mm×500 mm×0.50 mm in size was prepared as the transparent substrate. A resist resin containing a black dye was applied by spin coating atop this glass substrate, and patterned by photolithography. In this way, a 2 μm-thick black matrix was obtained with openings for forming the color filters. The pattern was formed with a width of 0.100 mm between subpixels and width of 0.116 between pixels.

A blue filter material (Fuji Film Color Mosaic CB-7001) was applied by spin coating, and patterned by photolithography to obtain a 2 μm-thick blue filter with a pitch of 0.780 mm.

Next, a green filter material (Fuji Film Color Mosaic CG-7001) was applied by spin coating, and patterned by photolithography to obtain a 2 μm-thick green filter with a pitch of 0.780 mm.

Finally, a red filter material (Fuji Film Color Mosaic CR-7001) was applied by spin coating, and patterned by photolithography to obtain a 2 μm-thick green filter with a pitch of 0.780 mm.

A positive-type photosensitive polyimide (Toray DL-1100) for bank formation was spin coated atop the black matrix and color filters to a film thickness of 3 μm. Next, this bank material layer was exposed with a photomask to 50 mJ/cm$^2$ of UV radiation containing light at a wavelength of 356 nm from the resin side to form banks superimposed on the black matrix pattern.

Dimethylphenyl-terminated poly[(9,9-dioctyl-2,7-divinylene-fluorenyl)-Alt-Co-{2-methoxy-5-(2-ethyl-hexyloxy)-1,4-phenylene}] (average molecular weight 200,000) was used for the first dye, and dimethylphenyl-terminated poly[2-5-bis(3,7-dimethyl-octyloxy)-1,4-phenylene vinylene] (average molecular weight 150,000) for the second dye. 50 parts by weight of a mixture of the first and second dyes (second dye concentration 3 wt %) was dissolved in 1000 parts by weight of toluene to prepare ink.

This ink had a contact angle of 15° with the banks. Three drops of this prepared ink (1 drop=about 14 μl) per 1 subpixel were dripped on the red color filter with a multinozzle in a nitrogen atmosphere using an inkjet unit (UniJet UJ200).

Without a break in vacuum, the ink was dried with a vacuum drying oven at a vacuum of $1.0×10^{-3}$ Pa and a temperature of 100° C. The resulting red color conversion film was 500 nm thick. This was further annealed at 200° C. to remove residual moisture.

In this way, a color modulation part was obtained comprising a pattern corresponding to the pixel configuration of the emitting part (640×RGB×480) on a 500 mm×500 mm×0.50 mm glass substrate.

Preparation of Organic Electroluminescent Part

A 500 mm×500 mm×0.50 mm glass substrate was prepared as the substrate. A TFT element was formed by known methods on this glass substrate.

Next, Al was vapor deposited on the entire surface to a thickness of 100 nm as a high reflectance electrode, and first electrodes (cathodes) were formed by photolithography for the 0.148×0.664 mm subpixel electrodes. Contacts were formed between the first electrodes and the drain of the TFT element via pinholes in the TFT substrate.

Using the positive type photoresist WIS-2 Å (a product of Nippon Zeon Co., Ltd.), a 1.0 μm-thick interlayer insulating film was formed with 0.148×0.664 mm openings in locations corresponding to the subpixels on the first electrodes. The interlayer insulating film formed an acute angle with the substrate.

The laminate with the formed first electrodes and interlayer insulating film was then mounted in a vapor deposition unit, and an electron transport layer, organic emitting layer and hole transport layer were formed in that order without any break in vacuum. The internal pressure of the vacuum tank was reduced to $1×10^{-4}$ for purposes of film formation. 40 nm of $Alq_3$ (tris 8-quinolinolate aluminum complex) was laminated for the electron transport layer. 40 nm of 4,4'-bis(2,2'-diphenylvinyl)biphenyl (DPVBi) as the host material doped with 5% 4,4'-bis[2-{4-(N,N-diphenylamino)phenyl}vinyl]biphenyl (DPAVBi) as the blue guest material was laminated as the organic emitting layer. 200 nm of α-NPD was laminated as the hole transport layer.

Next, transparent second electrodes were formed in a vacuum preparation chamber. The second electrodes were formed by sputtering a transparent electrode (ITO) over the entire surface to a film thickness of 100 nm.

Next, high-frequency electric power was applied to a mixed gas of monosilane ($SiH_4$), ammonia ($NH_3$) and nitrogen to form an inorganic barrier layer (SiN film). The monosilane flow volume was 100 sccm, the nitrogen flow volume was 200 sccm and the ammonia flow volume was 80 sccm. The pressure of the mixed gas was 100 Pa. High-frequency electric power with a frequency of 27.12 MHz and a power density of 0.5 W/cm$^2$ was used to form a SiN film with a film thickness of 3 μm on a 50° C. film formation substrate.

In this way, an organic emitting layer and the like with a pixel structure (640×RGB×480) was formed on a 500 mm×500 mm×0.50 mm substrate to obtain an organic electroluminescent part.

Superimposing Color Modulation Part and Organic Electroluminescent Part

Next, the organic electroluminescent part and the color modulation part containing the red color conversion layer obtained as described above were introduced into a dry nitrogen atmosphere (oxygen and moisture concentrations both 10 ppm or less), and sealed as follows using a UV curing adhesive.

The UV curing epoxy resin UV Resin XNR 5516 (Nagase Chemtex) was applied with a dispenser to the outer circumference of the color modulation part.

Next, only this outer adhesive layer was exposed with a shielding mask to ultraviolet light at 365 nm from a 6 J/cm$^2$ mercury ark lamp to pre-cure the resin, which was then heat cured by being fired for 1 hour at 100° C. in a furnace and left to cool naturally for 30 minutes in the furnace to obtain a multicolor emitting organic electroluminescent display.

Example 2 of Present Invention

Dimethylphenyl-terminated poly[(9,9-dioctyl-2,7-divinylene-fluorenyl)-Alt-Co-{2-methoxy-5-(2-ethyl-hexyloxy)-1,4-phenylene}] (average molecular weight 50,000) was used as the first dye and 4-dicyanomethylene-2-methyl-6-(p-dimethylaminostyryl)-4H-pyran (DCM-1) as the second dye to prepare the red color conversion layer of Example 1 of the present invention. The concentration of the second dye in the mixture of the first and second dyes was 0.2 wt %. 10 parts by weight of such a mixture was dissolved in 1000 parts by weight of toluene to prepare ink.

A multicolor emitting organic electroluminescent device was obtained as in Example 1 of the present invention except for the matters describe above.

Example 3 of Present Invention

The following compound (Compound A) prepared by Williamson ether synthesis of halogenated coumarin 6 and pentaerythritol was used as the oligomer of the first dye in preparing the red color conversion layer of Example 1 of the present invention.

C2:

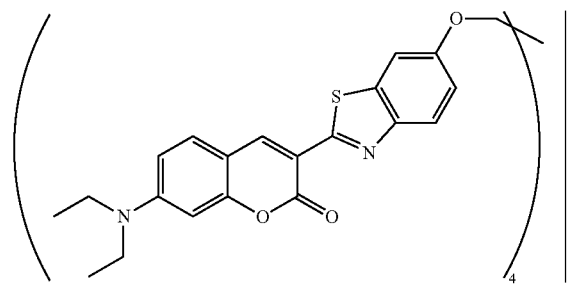

Using DCM-1 as the second dye, the concentration of the second dye in the mixture of the first and second dyes was 2 wt % in preparing the red color conversion layer of Example 1 of the present invention. 51 parts by weight of this mixture was dissolved in 1000 parts of toluene to prepare ink.

A multicolor emitting organic electroluminescent device was obtained as in Example 1 of the present invention except for the matters describe above.

Comparative Example 1

A red color conversion layer was formed with a thick film thickness by the conventional resin dispersion system described below.

Coumarin 6 (0.6 pts wt), Rhodamine 6G (0.3 pts wt) and Basic Violet 11 (0.3 pts wt) as fluorescent dyes were dissolved in 120 pts wt of propylene glycol monoethyl acetate (PG-MEA) as the solvent. 100 pts wt of the photopolymerizable resin "VPA100" (trade name, made by Nippon Steel Chemical Co., Ltd.) was added and dissolved to obtain a coating solution. This coating solution was spin coated on a substrate with a color filter formed thereon, and patterned by photolithography to obtain a red filter with a pitch of 0.780 nm and a film thickness of 10 µm.

A UV curing resin (epoxy denatured acrylate) was spin coated on this red filter and exposed with a high-pressure mercury lamp to obtain a 5 µm-thick gas barrier layer. The red filter pattern was not deformed, and the gas barrier layer had a flat upper surface as a protective layer.

A multicolor emitting organic electroluminescent device was obtained as in Example 1 of the present invention except for the matters described above.

Comparative Example 2

In this example, the first dye had a molecular weight outside the scope of the present invention or in other words a low molecular weight. The tetramer used in Example 3 of the present invention was used in dimer form (molecular weight 760) as the oligomer of the first dye. The concentration of the DCM-1 used as the second dye was 12 wt %. A multicolor emitting organic electroluminescent device was obtained as in Example 2 of the present invention except for the matters described above.

Comparative Example 3

A multicolor emitting organic electroluminescent device was obtained as in Example 3 of the present invention except that the Coumarin 6 was not oligomerized. Without oligomerization the solids coagulated and it was not possible to form a color conversion film.

Evaluation Items

The organic devices of Examples 1 to 3 of the present invention and Comparative Examples 1 through 3 were exposed to light at a wavelength of 450 to 490 nm from a light source placed facing the color conversion film. The outgoing light through the color conversion film was measured with a spectrophotometer (Konica Minolta CS-1000), and the outgoing light strength (fluorescent strength) of the red light at a wavelength of 610 nm was measured. To evaluate fluorescent strength, the fluorescence quantum efficiency of the red light was determined, and a score of 0.5 or more was judged passing (○) while a score of less than 0.5 was judged failing (x).

The luminous efficiency was also evaluated for the organic electroluminescent devices of Examples 1 to 3 of the present invention and Comparative Examples 1 to 3.

The results are shown in Table 1.

TABLE 1

|  | Fluorescent strength Red right | Luminous efficiency (cd/A) | Notes |
| --- | --- | --- | --- |
| Example 1 | ○ | 1.5 |  |
| Example 2 | ○ | 1.4 |  |
| Example 3 | ○ | 1.3 |  |
| Comp. Ex. 1 | ○ | 0.8 |  |
| Comp. Ex. 2 | X | 0.3 |  |
| Comp. Ex. 3 | X | — | No film formed |

It can be seen from Table 1 that with the multicolor emitting organic electroluminescent devices of Examples 1 to 3, which are within the scope of the present invention, excellent fluorescent strength is obtained even with red light, and excellent luminous efficiency of 1.3 cd/A or more is also obtained at a drive voltage of 10V.

It appears that in terms of red luminescent performance, the organic electroluminescent devices of these examples of the present invention had better luminous efficiency than the conventional examples using thick color conversion films, and a thin color conversion film with a host-guest structure using a polymer dye is effective for achieving luminous efficiency.

By contrast, with the multicolor emitting organic electroluminescent devices of Comparative Examples 1 to 3, which are outside the scope of the present invention, excellent fluorescent strength was not obtained with either green or red light, and luminous efficiency was inadequate at 0.8 cd/A or less.

It appears that in terms of red luminescent performance, the organic electroluminescent devices of these comparative examples did not exhibit good luminous efficiency because they were conventional products using thick color conversion films.

In particular, because the proportion of the first dye is extremely low in Comparative Example 2 in comparison with the examples of the present invention, the function of incident light absorption was not fully achieved with the first dye, and luminous efficiency was therefore extremely low.

What is claimed is:

1. A color conversion film that absorbs light from an organic electroluminescent part emitting blue-green light and converts the light to visible light at a longer wavelength, the color conversion film, comprising:
a first dye and a second dye that are different,
wherein the first dye is a polymer dye having an average molecular weight of 1000 to 1,000,000 and having properties including absorbing light incident on the color conversion film and transferring the absorbed energy of the light to the second dye without emitting light, and
wherein the second dye is a dye that receives the energy from the first dye and emits light.

2. The color conversion film according to claim 1, wherein the second dye is a polymer dye having an average molecular weight of 1000 to 1,000,000.

3. The color conversion film according to claim 1, wherein the second dye is a low-molecular-weight dye having an average molecular weight of less than 1000.

4. The color conversion film according to claim 1, wherein the first dye is an oligomer made up of fluorescent emitting cores bound to each other by non-covalent binding groups.

5. The color conversion film according to claim 4, wherein the first dye has an absorption spectrum having a maximum wavelength of 400 to 500 nm and a fluorescence spectrum having a maximum wavelength of 500 to 550 nm.

6. The color conversion film according to claim 4, wherein the second dye has an absorption spectrum having a maximum wavelength of 500 to 550 nm, and a fluorescence spectrum having a maximum wavelength of 550 to 650 nm.

7. The color conversion film according to claim 4, wherein the second dye is present in an amount of 10 wt % or less of the color conversion film.

8. The color conversion film according to claim 4, wherein the color conversion film is a coated film formed by a coating method.

9. The color conversion film according to claim 2, wherein the first dye is an oligomer made up of fluorescent emitting cores bound to each other by non-covalent binding groups.

10. The color conversion film according to claim 3, wherein the first dye is an oligomer made up of fluorescent emitting cores bound to each other by non-covalent binding groups.

11. A multicolor emitting organic electroluminescent device, comprising:
a pair of electrodes at least one of which is a transparent electrode;
an organic electroluminescent layer sandwiched between the pair of electrodes; and a color conversion film a first dye and a second dye that are different,
wherein the first dye is a polymer dye having an average molecular weight of 1000 to 1,000,000 and having properties including absorbing light incident on the color conversion film and transferring the absorbed energy of the light to the second dye without emitting light, and
wherein the second dye is a dye that receives the energy from the first dye and emits light.

12. The multicolor emitting organic electroluminescent device according to claim 11, wherein the second dye is a polymer dye having an average molecular weight of 1000 to 1,000,000.

13. The multicolor emitting organic electroluminescent device according to claim 11, wherein the second dye is a low-molecular-weight dye having an average molecular weight of less than 1000.

14. The multicolor emitting organic electroluminescent device according to claim 11, wherein the first dye is an oligomer made up of light emitting cores bound to each other by non-covalent binding groups.

15. The multicolor emitting organic electroluminescent device according to claim 14, wherein the first dye has an absorption spectrum having a maximum wavelength of 400 to 500 nm and a fluorescence spectrum having a maximum wavelength of 500 to 550 nm.

16. The multicolor emitting organic electroluminescent device according to claim 14, wherein the second dye has an absorption spectrum having a maximum wavelength of 500 to 550 nm, and a fluorescence spectrum having a maximum wavelength of 550 to 650 nm.

17. The multicolor emitting organic electroluminescent device according to claim 14, wherein the second dye is present in an amount of 10 wt % or less of the color conversion film.

18. The multicolor emitting organic electroluminescent device according to claim 14, wherein the color conversion film is a coated film formed by a coating method.

19. The multicolor emitting organic electroluminescent device according to claim 12, wherein the first dye is an oligomer made up of light emitting cores bound to each other by non-covalent binding groups.

20. The multicolor emitting organic electroluminescent device according to claim 13, wherein the first dye is an oligomer made up of light emitting cores bound to each other by non-covalent binding groups.

* * * * *